(12) United States Patent
Tanghe

(10) Patent No.: US 6,462,615 B1
(45) Date of Patent: Oct. 8, 2002

(54) HIGH SPEED CLOSED LOOP AMPLIFIER WITH GAIN ADJUSTMENT

(75) Inventor: Steven John Tanghe, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/682,639

(22) Filed: Oct. 1, 2001

(51) Int. Cl.[7] .................................................. G06G 7/26
(52) U.S. Cl. ........................................ 327/560; 330/254
(58) Field of Search .................. 327/108–112, 560–563; 330/254, 260, 261, 271, 278–285

(56) References Cited

U.S. PATENT DOCUMENTS 5,488,258 A * 1/1996 Honda ......................... 327/108
6,252,458 B1 * 6/2001 Shibata ........................ 330/261
6,297,698 B1 * 10/2001 Callahan, Jr. ................. 327/77

* cited by examiner

Primary Examiner—Kenneth B. Wells
(74) Attorney, Agent, or Firm—McGinn & Gibb, PLLC; Richard A. Henkler, Esq.

(57) ABSTRACT

A method and structure for an integrated circuit including a differential amplifier having at least two inputs and at least two outputs; a pair of first resistors, each of which is coupled to one of the inputs; a pair of first source followers, each of which is coupled to one of the first resistors; a pair of second source followers, each of which is coupled to one of the outputs; a pair of second resistors, each of which is coupled to one of the second source followers and to one of said inputs; and a gain device connected between the first resistors and the first source followers.

17 Claims, 2 Drawing Sheets

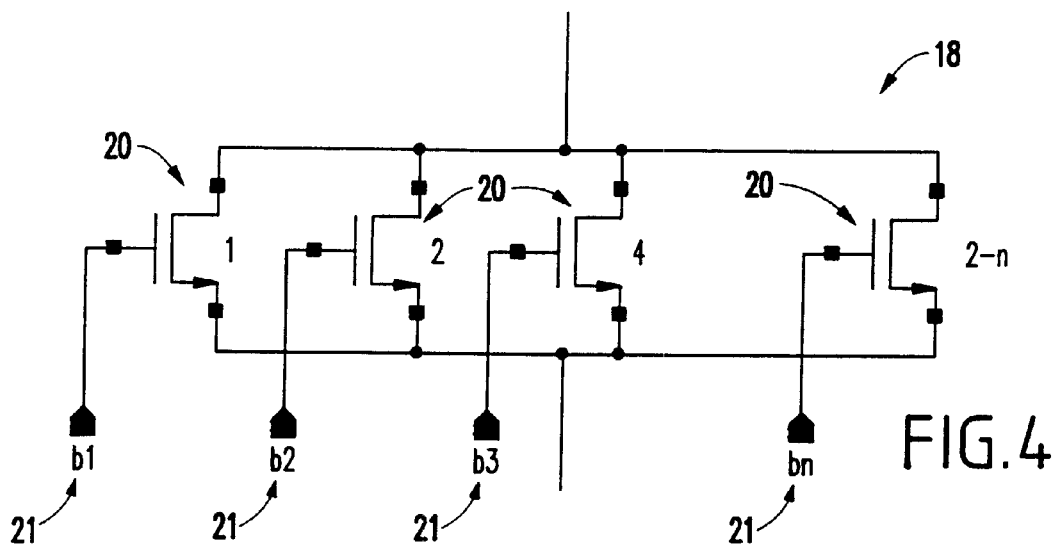
FIG.4
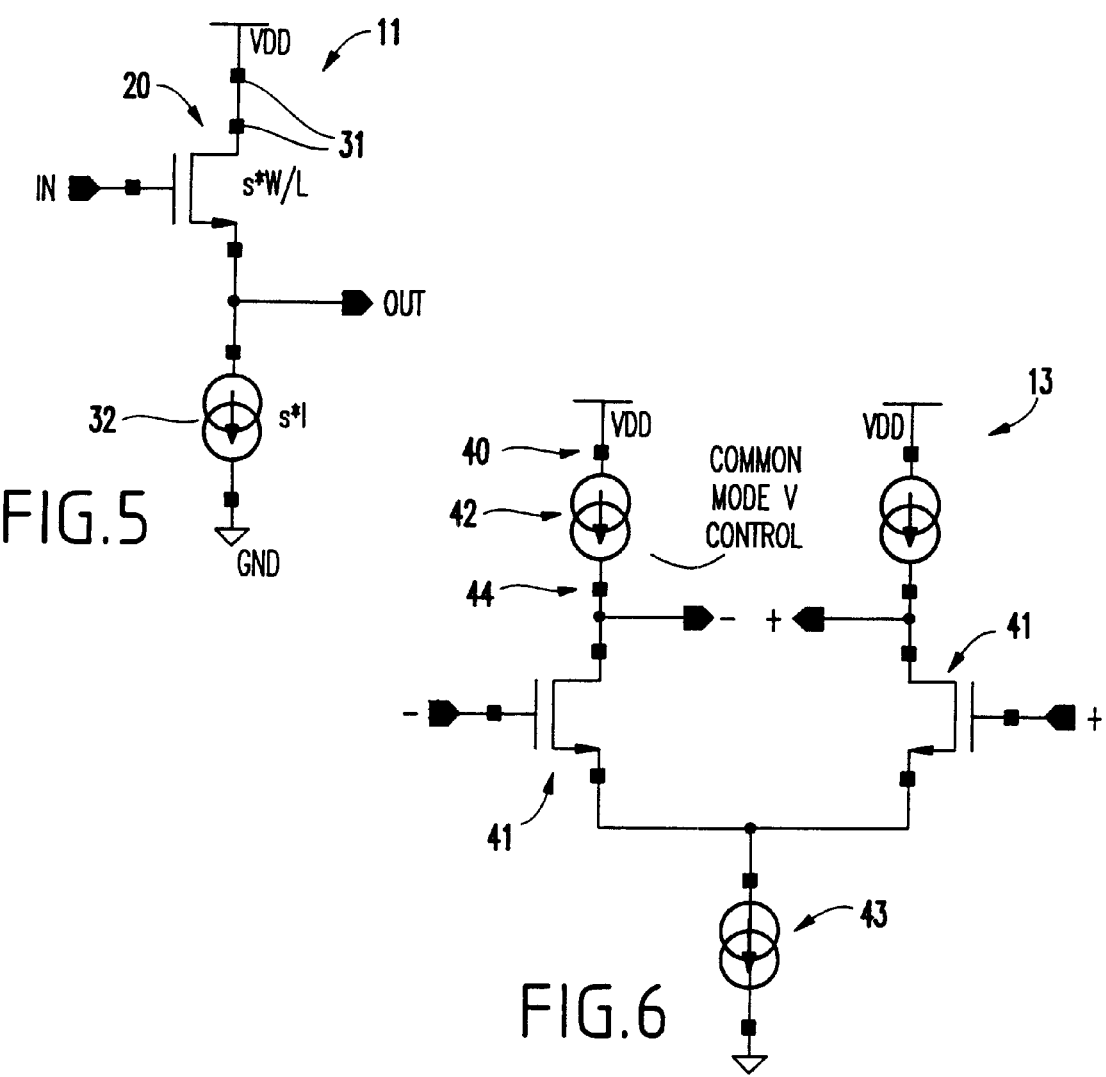
FIG.5
FIG.6

HIGH SPEED CLOSED LOOP AMPLIFIER WITH GAIN ADJUSTMENT

BACKGROUND OF THE INVENTION

The present invention generally relates to fully differential amplifiers and more particularly to an improved structure that utilizes a switching block having binary weighted field effect transistors to modify the amplifier gain and to provide that the gain control is largely insensitive to manufacturing variations and temperature changes and to maintain the high speed and stability of the amplifier, which would otherwise be compromised if a different gain adjust technique had been employed.

DESCRIPTION OF THE RELATED ART

An operational amplifier is a relatively high gain amplifier capable of being used in various kinds of feedback circuits for performing certain mathematical operations. For example, operational amplifier circuits can provide programmable gain, signal summation, integration, and differentiation, and various other useful functions too numerous to mention here. One of the most popular configurations of the operational amplifier is to provide fixed gain amplification (e.g., a gain of 10x) with the use of resistors in a feedback network. If the operational amplifier gain is high enough, then the overall gain with feedback is only determined by the ratio of resistors. Traditionally, an operational amplifier has one differential input and a single output. A fully differential operational amplifier is similar to traditional operational amplifier except that it has a differential output as well as a differential input. It too, can be configured as a feedback amplifier with the use of resistors to provide a fixed gain that is dependent on the ratio of resistors. Fully differential feedback amplifiers are widely used in modern integrated circuits because they have advantages over their single-ended counterparts including a larger output voltage swing and less susceptibility to common mode noise. There are countless applications for fully differential feedback amplifiers, such as in analog to digital converters (ADCs) and digital to analog converters (DACs). Two examples of fully differential feedback amplifiers are shown in FIGS. 1 and 2. In FIG. 1, the differential voltage gain is simply $R_3/R_1$ if the amplifier, represented by the triangular symbol 25, has a very high gain. More specifically, $$\frac{V_{od}}{V_{sd}} = \left(\frac{R_3}{R_1}\right) = \text{gain} \qquad [\text{t1}]$$

Thus, the overall gain is the dependent on a ratio of resistors, which should be independent of temperature and global process variations if the resistors are all of the same type and vary with temperature and process the same way. FIG. 2 shows a different feedback amplifier configuration. The amplifier's 26 gain is $(1+(R_B/R_A))$ and thus it is also dependent on the ratio of resistors. More specifically, $$\frac{V_{od}}{V_{sd}} = 1 + \frac{R_B}{R_A} \qquad [\text{t2}]$$

Although the gain in the amplifiers 25, 26 discussed above is independent of global process and temperature changes, it is subject to mismatch between the resistors. For example, consider the case of using the circuit of FIG. 1 configured to have a gain of two by making $R_3=2* R_1$. If there is process mismatch between $R_3$ and $R_1$, causing $R_3=2.1*R_1$, then the overall gain will be 2.1. Other second order effects can also cause non-ideal gains, such as low operational amplifier gain. For this reason, in applications that require a very precise gain, there is a need to adjust or calibrate the gain. Gain modification is also useful to make up for shortcomings in other amplifiers in the signal path. One application where this is used is in an ADC where an incoming signal is analog and must be amplified a precise amount before becoming digitized. Any error in this amplification translates to an overall gain error in the ADC.

One way to adjust the gain in a fully differential feedback amplifier such as that in FIG. 1, is to make the resistors adjustable. This can be done by replacing the resistors with FETs whose resistance can be varied by their gate voltage or by switching in parallel devices. Alternately, the resistors can be maintained, but parallel resistors can be switched in or out to effectively change their resistance. However, adding the necessary switches or controls to connect/disconnect the resistors or by using FETs as resistors, can reduce the quality of the amplifier, slowing it down, or making it unstable. The invention disclosure below details an improved differential feedback amplifier that has gain control yet largely remains insensitive to manufacturing variations and temperature changes and does this with no degradation in speed or stability. It also describes a means by which the fully differential feedback amplifier speed can be improved by using strategically placed buffers that are scaled in a manor that does not impact the circuit gain.

BRIEF SUMMARY OF THE INVENTION

In view of the foregoing and other problems, disadvantages, and drawbacks of the conventional differential amplifiers, the present invention has been devised, and it is an object of the present invention to provide a structure and method for an improved differential amplifier that has gain control that is largely insensitive to manufacturing variations and temperature changes and maintains or increases the bandwidth that the amplifier would have had without the gain control.

In order to attain the object(s) suggested above, there is provided, according to one aspect of the invention, an integrated circuit which includes a differential amplifier that has at least two inputs and at least two outputs. The invention also includes a pair of first resistors, each of which is coupled to one of the inputs; and a pair of first source followers, each of which is coupled to one of the first resistors. Further, the invention includes a pair of second source followers, each of which is coupled to one of the outputs; a pair of second resistors, each of which is coupled to one of the second source followers and to one of the inputs; and a gain device connected between the first resistors and the first source followers. The second source followers and the second resistors make up a feedback loop for the differential amplifier. The first and second pairs of fixed resistors as well as the gain device control the gain of the integrated circuit chip which remains largely insensitive to manufacturing process variations and temperature changes.

The gain device comprises a field effect transistor switching block. The field effect transistor switching block includes binary weighted resistive switches. The first source followers are scaled with respect to the second source followers in the same relationship that the second resistors are scaled to the first resistors. The integrated circuit chip optionally includes a pair of third source followers, each of which is connected to one of the outputs and to one of the second source followers. This third pair of source followers is used to buffer the differential amplifier output from any load that may be connected to the output in order to increase the speed of the resulting amplifier when heavily loaded.

This invention provides fully differential feedback amplifier that has the benefits of insensitivity to temperature and process variations and with a means to adjust or calibrate the gain. Also, through the use of the source followers in the input and feedback paths, the speed performance is enhanced over designs that do not contain these. These benefits are especially useful in high speed applications that require high analog voltage accuracy such as a high speed analog to digital converters or digital to analog converters.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which:

FIG. 4 is a schematic diagram of the switching block shown in FIG. 3;

FIG. 5 is a schematic diagram of the scalable source follower shown in FIG. 3; and FIG. 6 is a schematic diagram of the differential amplifier shown in FIG. 3.

DETAILED DESCRIPTION OF THE INVENTION

As mentioned above, closed loop amplifiers have a gain that is dependent on the ratio of components, typically resistors in the feedback path. If the gain is to be adjusted, these resistors need adjustment. However, adding the necessary switches or controls to selectively engage the resistors can reduce the quality of the amplifier slowing it down or making it unstable. The amplifier that is the subject of this disclosure provides a means to adjust the gain that does not alter these resistors. This keeps the signal in the feedback path clean and free of extra loading, thus allowing it to operate at high speed.

Figure 1:
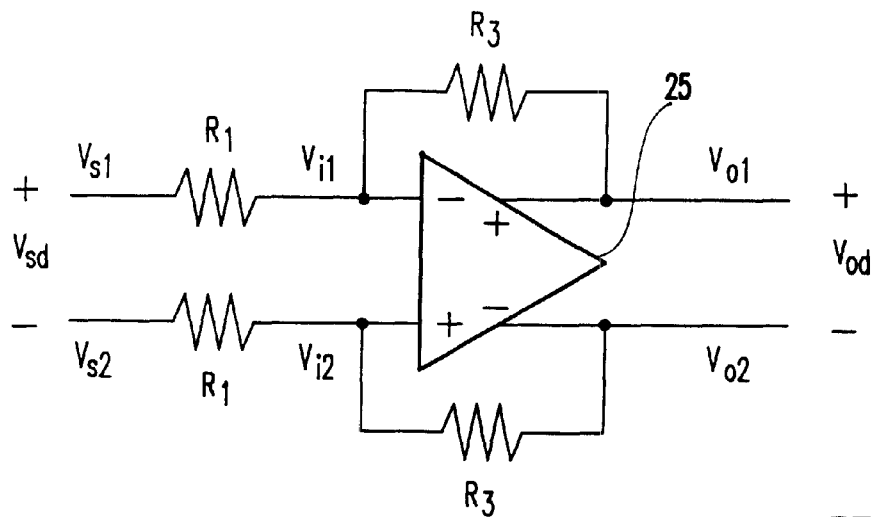
FIG. 1 is a schematic diagram of a fully differential feedback amplifier whose gain is not adjustable.
Figure 2:
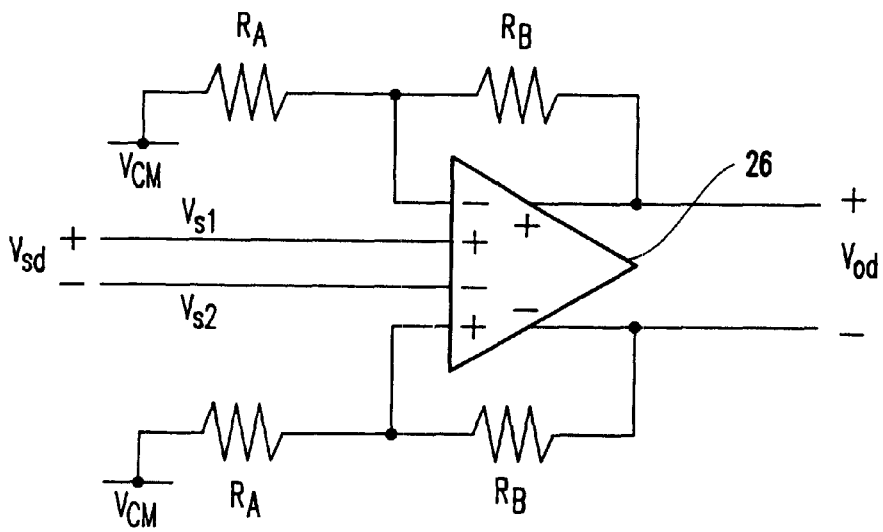
FIG. 2 is another schematic diagram of a fully differential feedback amplifier whose gain is not adjustable.
Figure 3:
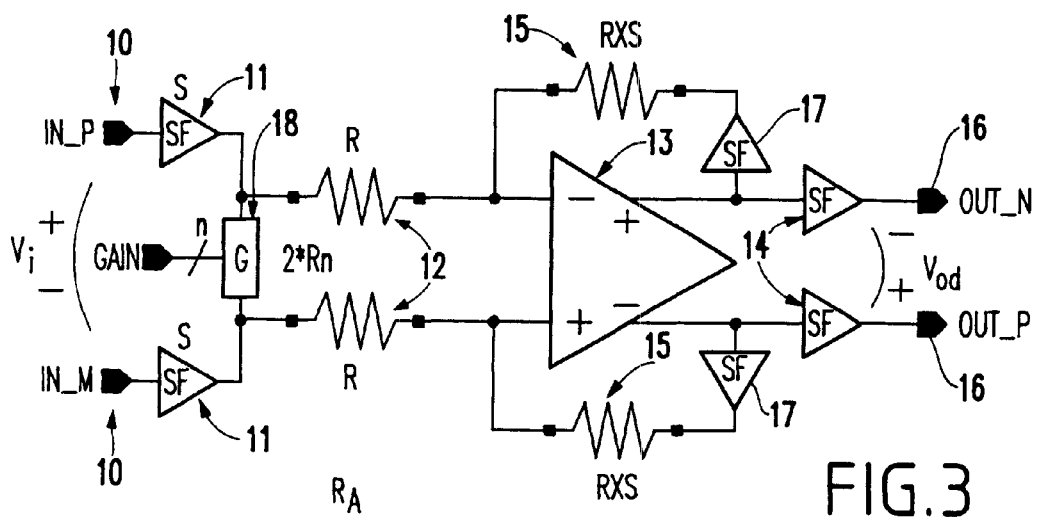
FIG. 3 is a schematic diagram of the inventive integrated circuit.

FIG. 3 shows one example of the invention. More specifically, in FIG. 3, a differential signal is applied to the inputs 10 and into a first pair of source followers 11. The signal is driven through resistors 12 of value R and into the differential amplifier 13. The amplifier 13 can take on many forms but preferably is a high speed fully differential design, as shown in greater detail in FIG. 6. The output of the amplifier is driven out though another set of source followers 14 and then to outputs 16. Negative feedback is provided to the inputs of the amplifier via source followers 17 and resistors 15 of value R×s. The scale factor 's' is used generically and is intended to represent scaling. These source followers 17 and resistors 15 act to "close the loop" of the amplifier. The source follower 11 structure is shown in FIG. 5. Again, the scale factor 's' is used so that the source followers 17 are scaled appropriately with source followers 11. For a source follower, this means that the currents are increased as "s" and the number of channels or fingers in the device is increased as "s".

The source follower as shown in FIG. 5 is a voltage buffer with a gain that is very nearly 1 V/V. It consists of a FET transistor 30 with gate coupled to the input, the drain 31 coupled to the power supply, and the source coupled to the output and to a current source 32. The AC voltage at the output of the source follower is roughly equal to the AC voltage at the input of the source follower. The DC voltage at the output of the source follower is offset from the DC voltage at the input of the source follower by an amount equal to the gate to source voltage of the source follower, which has an absolute voltage greater than the absolute threshold voltage of the FET 30. The output impedance of a source follower is approximately 1/gm, where gm represents the transconductance of the FET 30.

The differential amplifier as shown in FIG. 6 is a voltage amplifier with differential inputs and outputs. The differential amplifier includes of two FET transistors with gates coupled to the inputs, drains 40 coupled to the outputs and to load current sources 42 and with the sources coupled to a tail current source 43. Load current sources 42 are coupled from the power supply 40 to the differential amplifier outputs 44. The tail current source 43 is coupled between the sources of the FET transistors and the lower supply voltage or ground. A common mode control circuit is used to control the common mode output voltage of the amplifier and in this case is coupled to the load current sources 42. The differential input voltage is applied to the differential inputs of the differential amplifier. The differential output voltage appears at the differential output nodes 40 of the differential amplifier. The differential output voltage is equal to the differential input voltage multiplied by the gain of the differential amplifier. The differential gain of the amplifier is roughly equal to the transconductance of the FET transistors multiplied by the parallel combination of the output impedance of the FET transistors and the impedance of the load current sources 42. The differential gain of the differential amplifier is much higher than 1.

Ignoring for a moment, the effect of the source followers, the gain of the amplifier is (R/(R/s))=s. This is true for very high gain amplifiers 13. Thus, the gain of the amplifier is independent of the resistors and only dependent on the ratio of the resistors. With the invention, source followers 17,14 were added to buffer the critical high speed nodes, allowing the overall speed of the amplifier to flourish. The source followers 11 are used to block the flow of DC current into the amplifier, which is very important when the input signal comes from a charge-conserving node. The source followers 11 are also needed as a means to connect in the gain control block 18. The effects of the source followers 11 on the amplifier gain will be considered in the discussion below.

In many applications, it is desirable to be able to adjust the gain of the amplifier. This is not easily done without changing the resistor ratio in the feedback loop. However, changing the ratio poses a problem by requiring the switching of various resistors in and out of the feedback path as desired. Additionally, the resistors themselves could be made from resistive FET switches. In both cases, these added elements create unwanted parasitic capacitance in the feedback path. If the amplifier is to be used for high speed applications, these parasitic elements tend to slow it down, or worse, make it unstable. Another conventional method alters the gain of the open loop amplifier. However, this is also undesirable because the gain of the open loop amplifier should be kept as high as possible to maintain accurate closed loop gain independent of the open loop gain.

Breaking away from conventional structures, the invention varies the gain in the amplifier without adversely affecting its performance by inserting a FET switching block 18, into the circuit. This block is illustrated in more detail in FIG. 4. The switching block 18 contains FET transistors 20 that are selectively engaged (activated) under the control of control lines 21 and act as resistive switches to shunt some of the current between the source followers 11. This shunting reduces the signal level coming out of the followers 11, effectively reducing the gain. The FETs in the switch can be scaled in a binary fashion to easily form a binarily weighted resistive network, similar to a DAC structure. The resulting amplifier does not affect the resistors at the input 12 or in the feedback path 15 and thus the gain is still largely set by the ratio of these resistors and there is no additional loading to these resistors as there would be if FET switches were employed in the feedback path. Resistors in integrated circuits can be fabricated in such a way that they have very low voltage dependencies and possess very low parasitic capacitance, such as when they are made from polysilicon. This is in contrast to using FETs as variable resistors in the feedback path. FETs contain diffusions that can have high parasitic capacitance to the substrate or well, which degrades the speed performance of the amplifier. Also, the resistance of a FET is somewhat dependent on the signal voltage applied and thus the gain varies with the signal strength, introducing unwanted distortion into the signal path.

When the source followers and the gain block are taken into consideration, the gain equation for the amplifier is as follows:

$$\frac{V_o}{V_1} = S\left(\frac{g_{m1} + \frac{1}{R}}{g_{m1} + \frac{1}{R} + \frac{1}{R_n}}\right) \quad [t3]$$

where $g_{m1}$ is the transconductance of the input source follower (=gm×s), and Rn is the resistance of the FET switching block 18.

If the FET switching block 18 were removed, the resistance Rn would be infinity and the overall gain would simply be equal to s. Inserting the FET switching block 18 lowers the gain. If the overall conductance of the FET switching block, G=1/Rn, is much smaller than the grouping (gm$_1$+1/R), then any changes in the value of $R_n$ or the other components will have a small effect on the overall gain of the entire amplifier. Thus, this method is useful for small adjustments in the gain on the order of +/−10% from the nominal value.

As shown above, the desired nominal gain of the amplifier is equal to "s" The gain block 18 is used to modify the nominal gain of the amplifier away from the nominal value. In the notation used, it is shown that a source follower that is not scaled has an output impedance equal to roughly 1/gm. Having the source follower is scaled by "s" means that the output impedance is lower by a factor of "s" and is thus 1/(gm×s). If the scaling of s is used as described above (i.e., the input source followers 11 are "s" times bigger than the feedback source followers 15 and the feedback resistors 15 are "s" times bigger than the input resistors 12) then the gain equation is reduced to that shown above. Inspection of this equation shows that the overall amplifier gain is "s" perturbed by a small variation associated with Rn.

Thus, as shown above, the invention is a fully differential closed loop amplifier structure with buffering source followers 11 and 17 that are rationed with respect to one another in the same way that the feedback resistors 15 and input resistors 12 are scaled with respect to each other. This maintains an accurate gain that is insensitive to processing variability and temperature. With the invention, the switching FET matrix 18 (between the outputs of the first source follower circuits 11) alone is used to adjust the gain.

This invention provides fully differential feedback amplifier that has the benefits of insensitivity to temperature and process variations and with a means to adjustor calibrate the gain. Also, through the use of the source followers in the input and feedback paths, the speed performance is enhanced over designs that do not contain these. These benefits are especially useful in high speed applications that require high analog voltage accuracy such as a high speed analog to digital converters or digital to analog converters.

While the invention has been described in terms of preferred embodiments, those skilled in the art will recognize that the invention can be practiced with modification within the spirit and scope of the appended claims.

What is claimed is:

1. An integrated circuit comprising:
    a differential amplifier having at least two inputs and at least two outputs;
    a pair of first resistors, each of which is coupled to one of said inputs;
    a pair of first source followers, each of which is coupled to one of said first resistors;
    a pair of second source followers, each of which is coupled to one of said outputs;
    a pair of second resistors, each of which is coupled to one of said second source followers and to one of said inputs; and
    a gain device connected between said first resistors and said first source followers.

2. The integrated circuit in claim 1, wherein said second source followers and said second resistors make up a feedback loop for said differential amplifier.

3. The integrated circuit chip in claim 1, wherein said gain device controls a gain of said integrated circuit chip without making said integrated circuit sensitive to manufacturing process variations and temperature changes.

4. The integrated circuit in claim 1, wherein said gain device comprises a field effect transistor switching block.

5. The integrated circuit in claim 4, wherein said field effect transistor switching block includes binary weighted resistive switches.

6. The integrated circuit in claim 1, wherein said first source followers are scaled with respect to said second resistors second source followers and in a relationship related to the scaling of said second resistors to said first resistors.

7. The integrated circuit chip in claim 1, further comprising a pair of third source followers, each of which is connected to one of said outputs and to one of said second source followers.

8. An integrated circuit comprising:
    a differential amplifier having at least two inputs and at least two outputs;
    a pair of first resistors, each of which is coupled to one of said inputs;
    a pair of first source followers, each of which is coupled to one of said first resistors;
    a pair of second source followers, each of which is coupled to one of said outputs;
    a pair of second resistors, each of which is coupled to one of said second source followers and to one of said inputs; and a resistive field effect transistor switching block operatively connected to said inputs.

9. The integrated circuit in claim 8, wherein said second source followers and said second resistors make up a feedback loop for said differential amplifier.

10. The integrated circuit chip in claim 8, wherein said resistive field effect transistor switching block controls a gain of said integrated circuit chip without making said integrated circuit sensitive to manufacturing process variations and temperature changes.

11. The integrated circuit in claim 8, wherein said resistive field effect transistor switching block includes binary weighted resistive switches.

12. The integrated circuit in claim 8, wherein said first source followers are scaled with respect to said second source followers and in a relationship related to the scaling of said second resistors to said first resistors.

13. The integrated circuit chip in claim 8, further comprising a pair of third source followers, each of which is connected to one of said outputs and to one of said second source followers.

14. An integrated circuit comprising:

a differential amplifier having at least two inputs and at least two outputs;

a first pair of source followers each being coupled to one of the inputs;

a pair of resistors, each of which is coupled to one of the source followers and to one of the inputs;

a gain device operatively connected to the inputs; and a second pair of source followers connected to the gain device, the second pair of source followers being scaled with respect to the first source followers and in a relationship to the resistors.

15. The integrated circuit of claim 14 further comprising:

a third pair of source followers each coupled to one of the outputs and to one of the second pair of source followers.

16. An integrated circuit comprising:

a differential amplifier having at least two inputs and at least two outputs;

a first pair of some followers each being coupled to one of the inputs; and a second pair of source followers each being coupled to one of the inputs.

17. The integrated circuit of claim 16 further comprising:

a gain device operatively coupled to each one of the inputs and each one of the second pair of source followers.

* * * * *